(12) United States Patent
Kim (10) Patent No.: US 7,808,290 B2
(45) Date of Patent: Oct. 5, 2010

(54) SEMICONDUCTOR INTEGRATED CIRCUIT AND METHOD OF CONTROLLING THE SAME

(75) Inventor: Kyoung Nam Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 49 days.

(21) Appl. No.: 12/333,180

(22) Filed: Dec. 11, 2008

(65) Prior Publication Data

US 2010/0033219 A1 Feb. 11, 2010

(30) Foreign Application Priority Data

Aug. 8, 2008 (KR) ............. 10-2008-0077701

(51) Int. Cl.
*H03L 7/06* (2006.01)
(52) U.S. Cl. .................. 327/158; 327/149
(58) Field of Classification Search ............... None
See application file for complete search history.

(56) References Cited

U.S. PATENT DOCUMENTS

| 7,528,639 | B2 * | 5/2009 | Choi ................ 327/158 |
| 7,676,686 | B2 * | 3/2010 | Ku et al. ........... 713/600 |
| 2005/0093599 | A1 | 5/2005 | Kwak |
| 2008/0136476 | A1 * | 6/2008 | Ku .................... 327/158 |

FOREIGN PATENT DOCUMENTS

| JP | 2007-095267 | 4/2007 |
| JP | 2007-295592 | 11/2007 |
| KR | 1020070035943 | 4/2007 |
| KR | 1020070036547 | 4/2007 |
| KR | 1020070036561 | 4/2007 |
| KR | 1020070036562 | 4/2007 |

\* cited by examiner

*Primary Examiner*—Cassandra Cox
(74) *Attorney, Agent, or Firm*—Baker & McKenzie LLP (57) ABSTRACT

A semiconductor integrated circuit includes a delay locked loop (DLL) control block configured to generate a buffer enable signal, the buffer enable signal being a pulse signal that is periodically enabled when a smart power down signal is enabled, and a DLL circuit configured to control a phase of an external clock signal in response to the buffer enable signal to generate an output clock signal.

25 Claims, 6 Drawing Sheets

SEMICONDUCTOR INTEGRATED CIRCUIT AND METHOD OF CONTROLLING THE SAME

CROSS-REFERENCES TO RELATED APPLICATION

The present application claims the benefit under 35 U.S.C 119(a) to Korean Application No. 10-2008-0077701, filed on Aug. 8, 2008, in the Korean Intellectual Property Office, which is incorporated herein by reference in its entirety as if set forth in full.

BACKGROUND

1. Technical Field

The embodiments described herein relate to a semiconductor integrated circuit (IC) and a method of controlling the same and, more particularly, to a semiconductor IC that includes a delay locked loop (DLL) circuit and a method of controlling the same.

2. Related Art

In general, a DLL circuit included in a semiconductor IC is commonly used to provide an internal clock signal having phases with a predetermined time earlier than a phase of a reference clock signal obtained by converting an external clock signal. The internal clock signal used in the semiconductor IC is delayed by a clock buffer and a transmission line, wherein a phase difference is generated between the internal clock signal and the external clock signal that results in increasing an output data access time. For this reason, the DLL circuit is used in order to increase an effective data output interval. Here, the DLL circuit performs a control operation such that the phase of the internal clock signal is a predetermined time earlier than the phase of the external clock signal.

The semiconductor IC implements a power down mode to decrease power consumption and stops power supply to internal areas during the power down mode. Similarly to the semiconductor IC, the DLL circuit also stops the operation of a clock input buffer during the power down mode, thereby stopping a clock generation operation. The DLL circuit includes a buffer control unit that determines whether or not to operate the clock input buffer according to whether or not a corresponding mode is in the power down mode.

In the semiconductor IC that implements the power down mode, when the power down mode is completed, a power supply voltage of the DLL circuit may be different from a power supply voltage before a corresponding mode shifts to the power down mode. The DLL circuit may be affected by electronic noise that occurs due to various factors in addition to the change in the power supply voltage of the DLL circuit. Thus, a phase and a duty cycle of a clock signal output from the DLL circuit may be different from a phase and a duty cycle before the corresponding mode shifts to the power down mode. As a result, performance of the DLL circuit can be deteriorated, thereby causing an error in the data output operation. In order to improve performance of the DLL circuit and secure reliability of the data output operation, it is required to prevent an erroneous operation from occurring.

SUMMARY

A semiconductor IC that implements a smart power down mode of a DLL circuit to stably generate a clock and a method of controlling the same are described herein.

In one aspect, A semiconductor integrated circuit includes a delay locked loop (DLL) control block configured to generate a buffer enable signal, the buffer enable signal being a pulse signal that is periodically enabled when a smart power down signal is enabled; and a DLL circuit configured to control a phase of an external clock signal in response to the buffer enable signal to generate an output clock signal.

In another aspect, a semiconductor integrated circuit includes a clock control unit configured to generate a control clock signal using a buffering clock in response to a smart power down signal and an active mode signal; a power down control unit configured to generate a clock enable signal in response to the control clock signal, the smart power down signal, and a normal power down signal; a buffer control unit configured to generate a buffer enable signal in response to the clock enable signal and the active mode signal; and a clock input buffer configured to buffer an external clock signal in response to the buffer enable signal to output the buffered external clock as a reference clock signal.

In another aspect, a method of controlling a semiconductor integrated circuit includes driving a buffering clock in response to an active mode signal during a smart power down mode to generate a control clock signal; generating a buffer enable signal that is periodically enabled using the control clock signal; periodically activating a delay locked loop (DLL) circuit in response to the buffer enable signal; and disabling the control clock signal when the smart power down mode is completed, wherein the generating a buffer enable signal occurs according to whether or not a normal power down mode is executed to control the operation of the DLL circuit.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
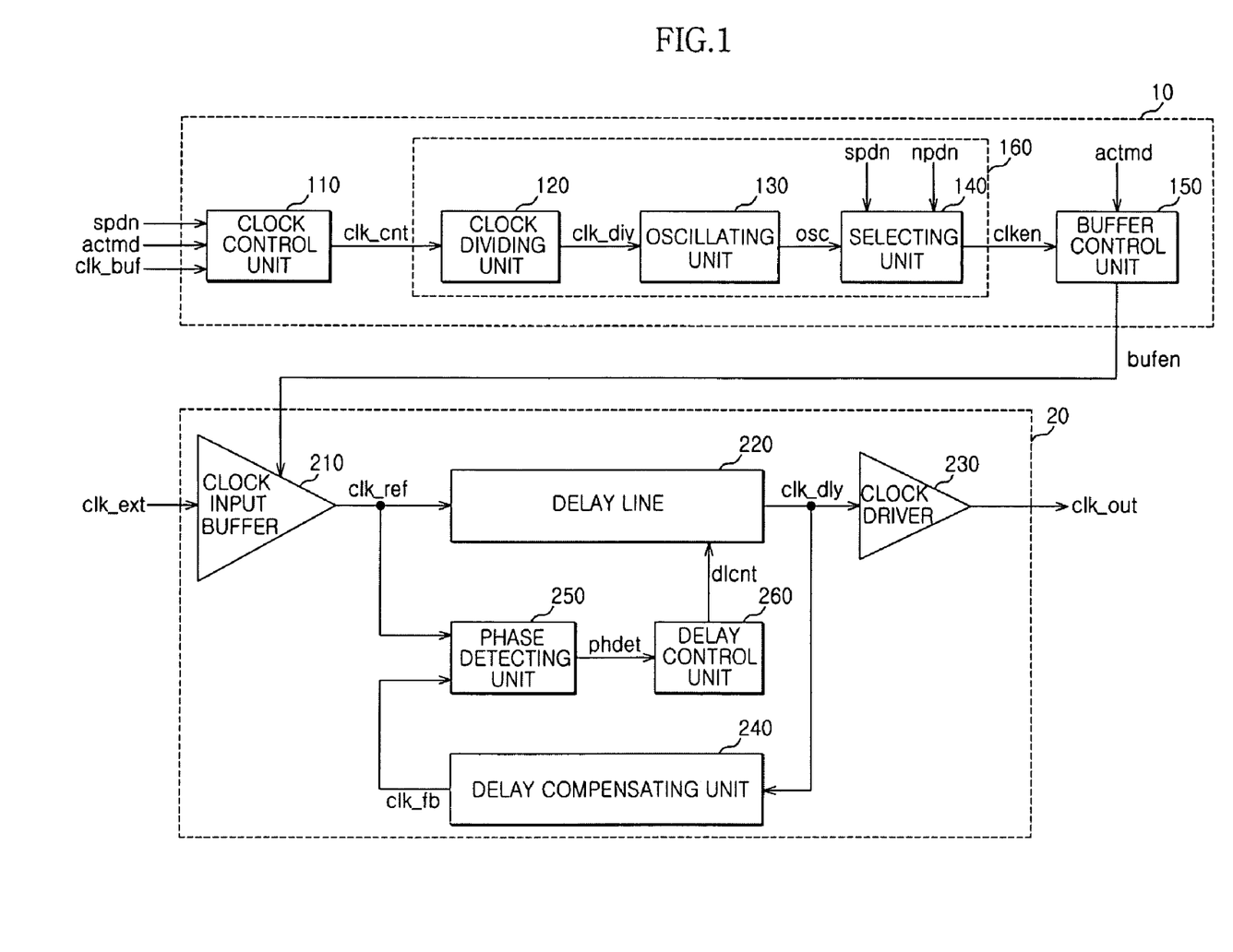
FIG. 1 is a schematic block diagram of an exemplary semiconductor IC according to one embodiment.

FIG. 1 is a schematic block diagram of an exemplary semiconductor IC according to one embodiment. In FIG. 1, a semiconductor integrated circuit can be configured to include a DLL control block 10 and a DLL circuit 20.

The DLL control block 10 can generate a buffer enable signal 'bufen' in response to a buffering clock signal 'clk_buf', a smart power down signal 'spdn', a normal power down signal 'npdn', and an active mode signal 'actmd'. Here, when the active mode signal 'actmd' is enabled and the smart power down signal 'spdn' is enabled, the DLL control block 10 can implement the buffer enable signal 'bufen' as a pulse signal that is periodically enabled. When the active mode signal 'actmd' is enabled and the smart power down signal 'spdn' is disabled, the DLL control block 10 can drive the normal power down signal 'npdn' to generate the buffer enable signal 'bufen'. When the active mode signal 'actmd' is disabled, the DLL control block 10 can disable the buffer enable signal 'bufen'.

The DLL control block 10 can include a clock control unit 110, a clock dividing unit 120, an oscillating unit 130, a selecting unit 140, and a buffer control unit 150.

The clock control unit 110 can generate a control clock signal 'clk_cnt' using the buffering clock signal 'clk_buf' in response to the smart power down signal 'spdn' and the active mode signal 'actmd'.

The clock dividing unit 120 can divide the control clock signal 'clk_cnt' by a predetermined division ratio, and can generate a division clock signal 'clk_div'.

The oscillating unit 130 can periodically oscillate a pulse signal in response to the division clock signal 'clk_div', and can output the pulse signal as an oscillation signal 'osc'.

The selecting unit 140 can selectively drive the oscillation signal 'osc' or the normal power down signal 'npdn' in response to the smart power down signal 'spdn', and can generate a clock enable signal 'clken'.

The buffer control unit 150 can generate a buffer enable signal 'bufen' in response to the clock enable signal 'clken' and the active mode signal 'actmd'.

The clock dividing unit 120, the oscillating unit 130, and the selecting unit 140 can be collectively referred to as a power down control unit 160. For example, the power down control unit 160 can generate the clock enable signal 'clken' in response to the control clock signal 'clk_cnt', the smart power down signal 'spdn', and the normal power down signal 'npdn'.

The DLL circuit 20 can control a phase of a reference clock signal 'clk_ref' and can generate an output clock signal 'clk_out' in response to the buffer enable signal 'bufen'. The DLL circuit 20 can be activated when the buffer enable signal 'bufen' is enabled, and can perform the operation of using an external clock signal 'clk_ext' to generate the output clock signal 'clk_out'. When the buffer enable signal 'bufen' is disabled, the DLL circuit 20 can stop the operation of using the external clock signal 'clk_ext' to generate the output clock signal 'clk_out'.

In FIG. 1, the DLL circuit 20 can include a clock input buffer 210, a delay line 220, a clock driver 230, a delay compensating unit 240, a phase detecting unit 250, and a delay control unit 260.

The clock input buffer 210 can buffer the external clock signal 'clk_ext' in response to the buffer enable signal 'bufen', and can output the external clock signal as the reference clock signal 'clk_ref'.

The delay line 220 can delay the reference clock signal 'clk_ref' by a predetermined time in response to the delay control signal 'dlcnt', and can generate a delay clock signal 'clk_dly'.

The clock driver 230 can drive the delay clock signal 'clk_dly', and can output the output clock signal 'clk_out'.

The delay compensating unit 240 can supply a delay value, which can be obtained by simulating a delay amount of delay elements on an output path of the delay clock signal 'clk_dly', to the delay clock signal 'clk_dly', and can generate a feedback clock signal 'clk_fb'.

The phase detecting unit 250 can detect and compare phases of the reference clock signal 'clk_ref' and the feedback clock signal 'clk_fb', and can generate a phase detection signal 'phdet'.

The delay control unit 260 can generate the delay control signal 'dlcnt' in response to the phase detection signal 'phdet'.

The smart power down signal 'spdn' can be enabled when implementing a power down mode to prevent the phase of the output clock signal 'clk_out' of the DLL circuit 20 from being distorted, by implementing the power down mode of the DLL circuit 20 that is a smart power down mode while periodically activating the DLL circuit 20. The smart power down signal 'spdn' may be implemented using a fuse option or a test mode.

The active mode signal 'actmd' can be enabled in response to an input of an active command, and can be disabled in response to an input of a precharge command.

In the semiconductor IC, only when both the smart power down signal 'spdn' and the active mode signal 'actmd' are enabled, the clock control unit 110 can drive the buffering clock signal 'clk_buf', and generate the control clock signal 'clk_cnt'. For example, the clock control unit 110 can allow the control clock signal 'clk_cnt' to be toggled only when the smart power down mode is executed and the semiconductor IC performs an active mode operation. Conversely, when the smart power down signal 'spdn' is disabled or the active mode signal 'actmd' is disabled, i.e., when the smart power down mode is not executed or the precharge mode is executed, the clock control unit 110 can lock a voltage level of the control clock signal 'clk_cnt' to a low level.

Then, the clock dividing unit 120 can divide the control clock signal 'clk_cnt' by a predetermined division ratio to generate the division clock signal 'clk_div'. For example, the division ratio can be 32.

The oscillating unit 130 can use the division clock signal 'clk_div' to generate the oscillation signal 'osc'. Here, the oscillation signal 'osc' can be implemented in a form of a pulse signal that is periodically toggled. For example, the oscillation signal 'osc' can be implemented such that the oscillation signal 'osc' is enabled once for every 512 periods of the buffering clock signal 'clk_buf', and can have an enable interval corresponding to 64 periods of the buffering clock signal 'clk_buf'.

If the smart power down signal 'spdn' is enabled, then the selecting unit 140 does not inversely drive the oscillation signal 'osc', and can generate the clock enable signal 'clken'. If the smart power down signal 'spdn' is disabled, then the selecting unit 140 can inversely drive the normal power down signal 'npdn', and can generate the clock enable signal 'clken'. For example, when the smart power down mode is implemented, the clock enable signal 'clken' can be implemented in a form of a pulse signal that is periodically enabled. When the smart power down mode is not implemented, the clock enable signal 'clken' can be implemented in a form of a signal that is enabled or disabled according to whether the normal power down mode is implemented or not.

If the active mode signal 'actmd' is enabled, then the buffer control unit 150 can output the clock enable signal 'clken' as the buffer enable signal 'bufen'. Thus, when the precharge mode is executed, the buffer enable signal 'bufen' can be disabled, and when the active mode is executed, the buffer enable signal 'bufen' can be enabled or disabled according to whether the smart power down mode is executed or not. For example, if the smart power down mode is implemented during the active mode, then the buffer enable signal 'bufen' can be implemented in a form of a pulse signal that is periodically enabled during a predetermined interval. If the smart power down mode is not executed, then the buffer enable signal 'bufen' can be implemented in a form of a signal that is enabled or disabled according to whether the normal power down mode is executed or not.

Since the clock input buffer 210 can be activated or inactivated according to whether the buffer enable signal 'bufen' is enabled or disabled, the entire operation of the DLL circuit 20 can be determined. Accordingly, the clock enable signal 'clken' can be implemented in a form of a pulse signal that is periodically enabled according to whether the smart power down mode is executed or not, or implemented in a form of a signal that is enabled or disabled according to whether the normal power down mode is executed or not. In addition, the semiconductor IC can selectively use the clock enable signal 'clken' according to whether a corresponding mode is in an active mode or a precharge mode to enable or disable the buffer enable signal 'bufen'. Accordingly, the DLL circuit 20 can be activated only during an interval in which the output clock signal 'clk_out' is necessary. Thus, power efficiency of the semiconductor IC can be improved.

In the semiconductor IC, when the smart power down mode is not executed or the precharge mode is executed, a voltage level of the control clock signal 'clk_cnt' can be locked to a low level. Accordingly, the clock dividing unit 120 and the oscillating unit 130 are not activated during an interval in which the output clock signal is not needed, thereby further decreasing power consumption.

Figure 2:
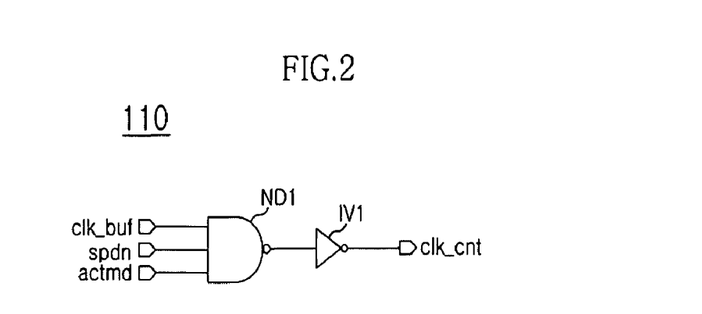
FIG. 2 is a schematic diagram of an exemplary clock control unit capable of being implemented in the circuit of FIG. 1 according to one embodiment.

FIG. 2 is a schematic diagram of an exemplary clock control unit capable of being implemented in the circuit of FIG. 1 according to one embodiment. In FIG. 2, the clock control unit 110 can include a first NAND gate ND1 and a first inverter IV1.

The first NAND gate ND1 can receive the buffering clock signal 'clk_buf', the smart power down signal 'spdn', and the active mode signal 'actmd'. The first inverter IV1 can receive an output signal from the first NAND gate ND1, and can output the control clock signal 'clk_cnt'. Accordingly, if the smart power down signal 'spdn' or the active mode signal 'actmd' is disabled, then the clock control unit 110 can lock the control clock signal 'clk_cnt' to a low level regardless of an input of the buffering clock signal 'clk_buf'. If both the smart power down signal 'spdn' and the active mode signal 'actmd' are enabled, then the clock control unit 110 can drive the buffering clock signal 'clk_buf', and can generate the control clock signal 'clk_cnt'. Accordingly, the control clock signal 'clk_cnt' may be implemented in a form of a clock signal that is periodically toggled when a corresponding mode changes from a smart power down mode to an active mode.

Figure 3:
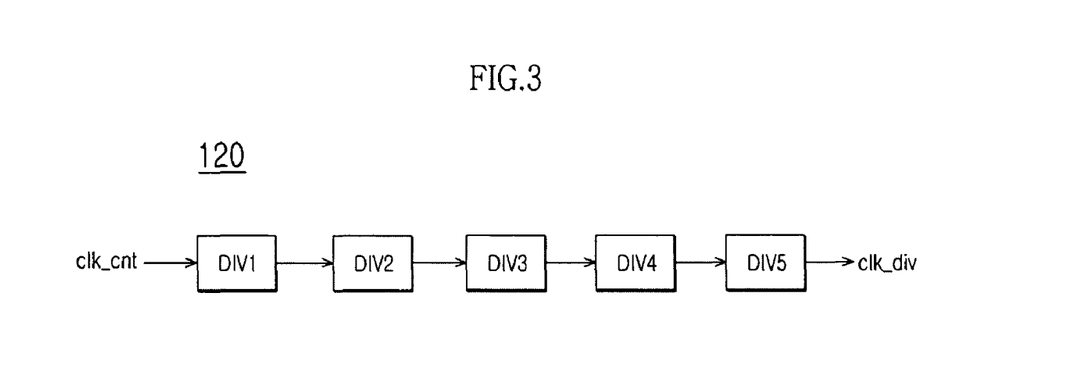
FIG. 3 is a schematic diagram of an exemplary clock dividing unit capable of being implemented in the circuit of FIG. 1 according to one embodiment.

FIG. 3 is a schematic diagram of an exemplary clock dividing unit capable of being implemented in the circuit of FIG. 1 according to one embodiment. In FIG. 3, a clock dividing unit can divide a frequency of the control clock signal 'clk_cnt' by 32, for example, and can generate the division clock signal 'clk_div', as described above.

In FIG. 3, the clock dividing unit 120 may be implemented by connecting first to fifth clock dividers DIV1 to DIV5 in series. Here, the first clock divider DIV1 can receive the control clock signal 'clk_cnt', and the fifth clock divider DIV5 can output the division clock signal 'clk_div'. Each of the clock dividers can be configured to divide a frequency of an input clock signal by two and output a generated clock signal. For example, each of the clock dividing units may be implemented using a flip-flop to which an inverted signal of an output signal is fed back.

Figure 4:
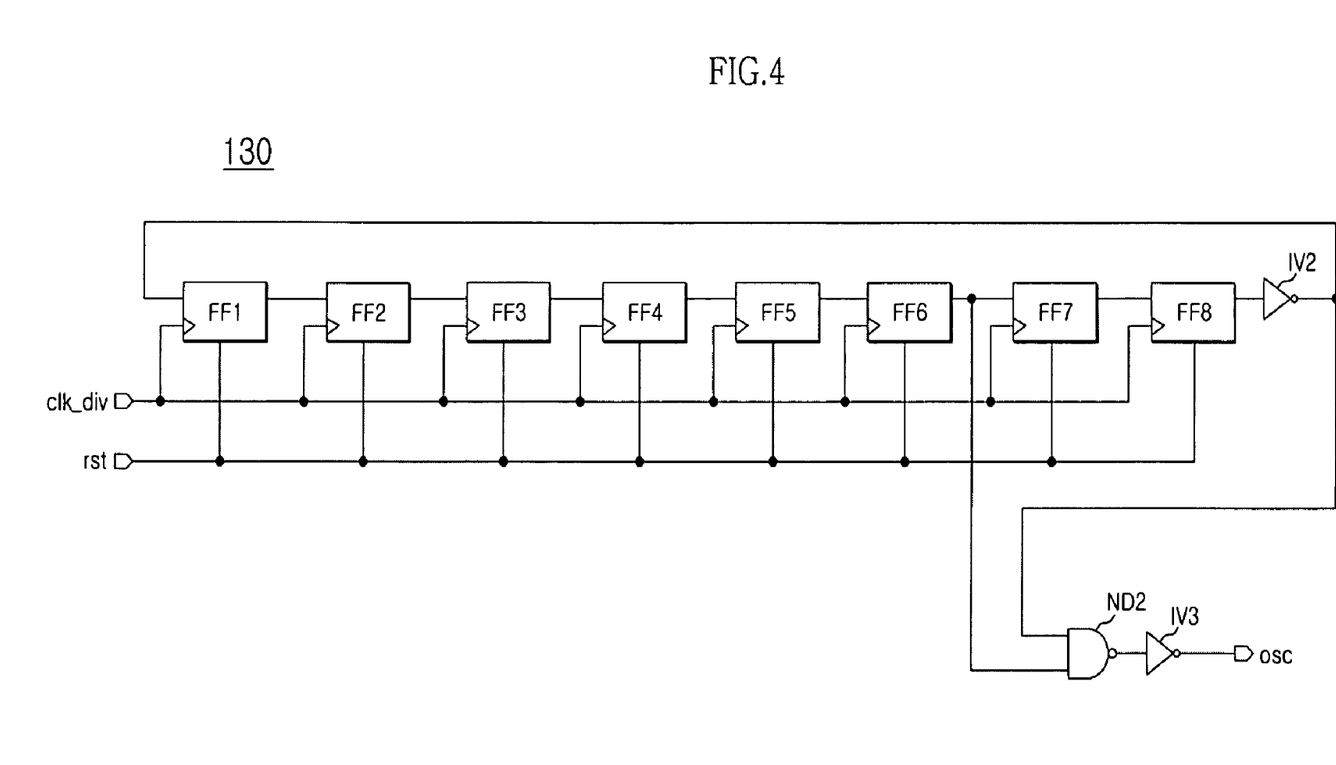
FIG. 4 is a schematic diagram of an exemplary oscillating unit capable of being implemented in the circuit of FIG. 1 according to one embodiment.

FIG. 4 is a schematic diagram of an exemplary oscillating unit capable of being implemented in the circuit of FIG. 1 according to one embodiment. In FIG. 4, an oscillating unit can generate the oscillation signal 'osc' that is enabled once for every 512 periods of the buffering clock signal 'clk_buf', and can have an enable interval corresponding to 64 periods of the buffering clock signal 'clk_buf', as described above.

In FIG. 4, the oscillating unit 130 can include first to eighth flip-flops FF1 to FF8, a second inverter IV2, a second NAND gate ND2, and a third inverter IV3.

Each of the first to eight flip-flops FF1 to FF8 can be configured to latch a signal output from a previous stage in response to the division clock signal 'clk_div', and can transmit the latched signal to a subsequent stage. Accordingly, an output signal of the second inverter IV2 can be fed back to the first flip-flop FF1. In addition, each of the first to eighth flip-flops FF1 to FF8 may be initialized by a reset signal 'rst'.

The second inverter IV2 can receive an output signal of the eighth flip-flop FF8. The second NAND gate ND2 can receive an output signal of the sixth flip-flop FF6 and an output signal of the second inverter IV2. The third inverter IV3 can receive an output signal of the second NAND gate ND2 and can output the oscillation signal 'osc'.

Since the division clock signal 'clk_div' can have a period that is 32 times longer than a period of the buffering clock signal 'clk_buf', a shifting operation that is performed by the first to eighth flip-flops FF1 to FF8 can be performed once for every 32 periods of the buffering clock signal 'clk_buf'. Accordingly, an output signal of the second inverter IV2 can have a high-level voltage during 256 periods of the buffering clock signal 'clk_buf', and then can have a low-level voltage during the other 256 periods of the buffering clock signal 'clk_buf'. The oscillation signal 'osc' that is output as a result of performing an AND operation using the second NAND gate ND2 and the third inverter IV3 may have a high-level voltage from a point of time when the sixth flip-flop FF6 outputs a high-level signal to a point of time when the eighth flip-flop FF8 outputs a high-level signal. The interval during which the oscillation signal 'osc' has a high-level voltage can correspond to 64 periods of the buffering clock signal 'clk_buf'.

Figure 5:
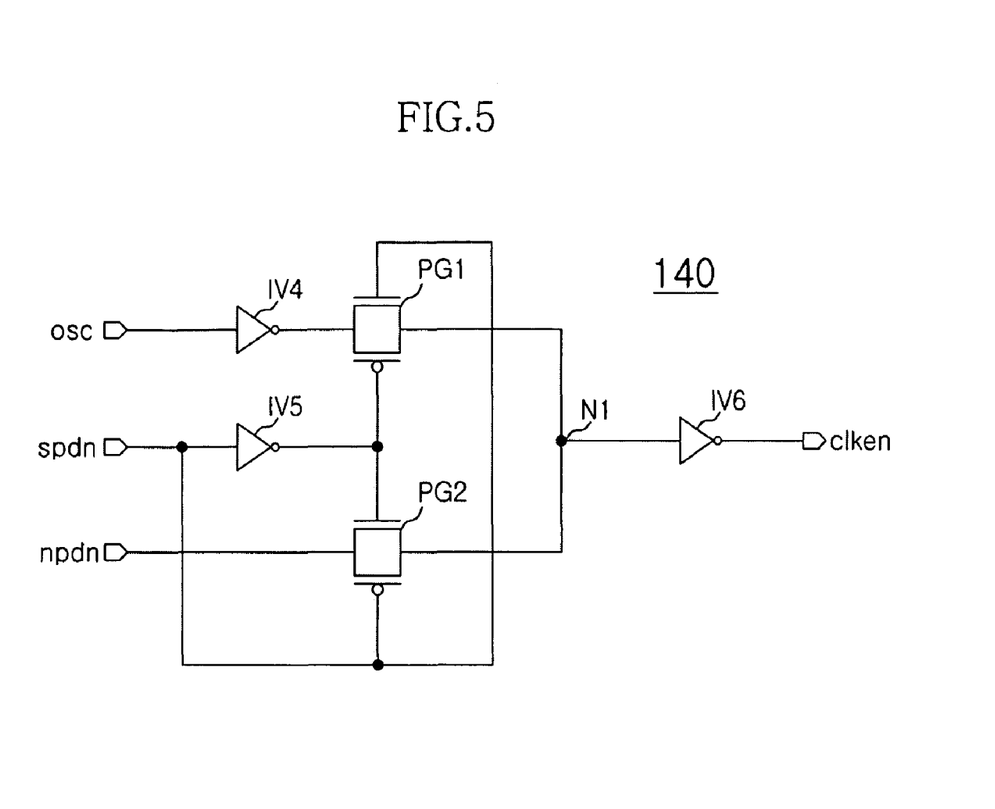
FIG. 5 is a schematic diagram of an exemplary selecting unit capable of being implemented in the circuit of FIG. 1 according to one embodiment.

FIG. 5 is a schematic diagram of an exemplary selecting unit capable of being implemented in the circuit of FIG. 1 according to one embodiment. In FIG. 5, the selecting unit 140 can include a fourth inverter IV4, a fifth inverter IV5, a sixth inverter IV6, a first pass gate PG1, and a second pass gate PG2.

The fourth inverter IV4 can receive the oscillation signal 'osc', and the fifth inverter IV5 can receive the smart power down signal 'spdn'. The first pass gate PG1 can transmit an output signal of the fourth inverter IV4 to a first node N1, in response to the smart power down signal 'spdn' and an output signal of the fifth inverter IV5. The second pass gate PG2 can transmit the normal power down signal 'npdn' to the first node N1, in response to the smart power down signal 'spdn' and the output signal of the fifth inverter IV5. The sixth inverter IV6 can be supplied with a voltage supplied to the first node N1, and can output the clock enable signal 'clken'.

Accordingly, the clock enable signal 'clken' can have substantially the same waveform as the oscillation signal 'osc' when the smart power down signal 'spdn' is enabled. In addition, when the smart power down signal 'spdn' is disabled, the clock enable signal 'clken' can have a waveform of an inverted signal of the normal power down signal 'npdn'.

Figure 6A:
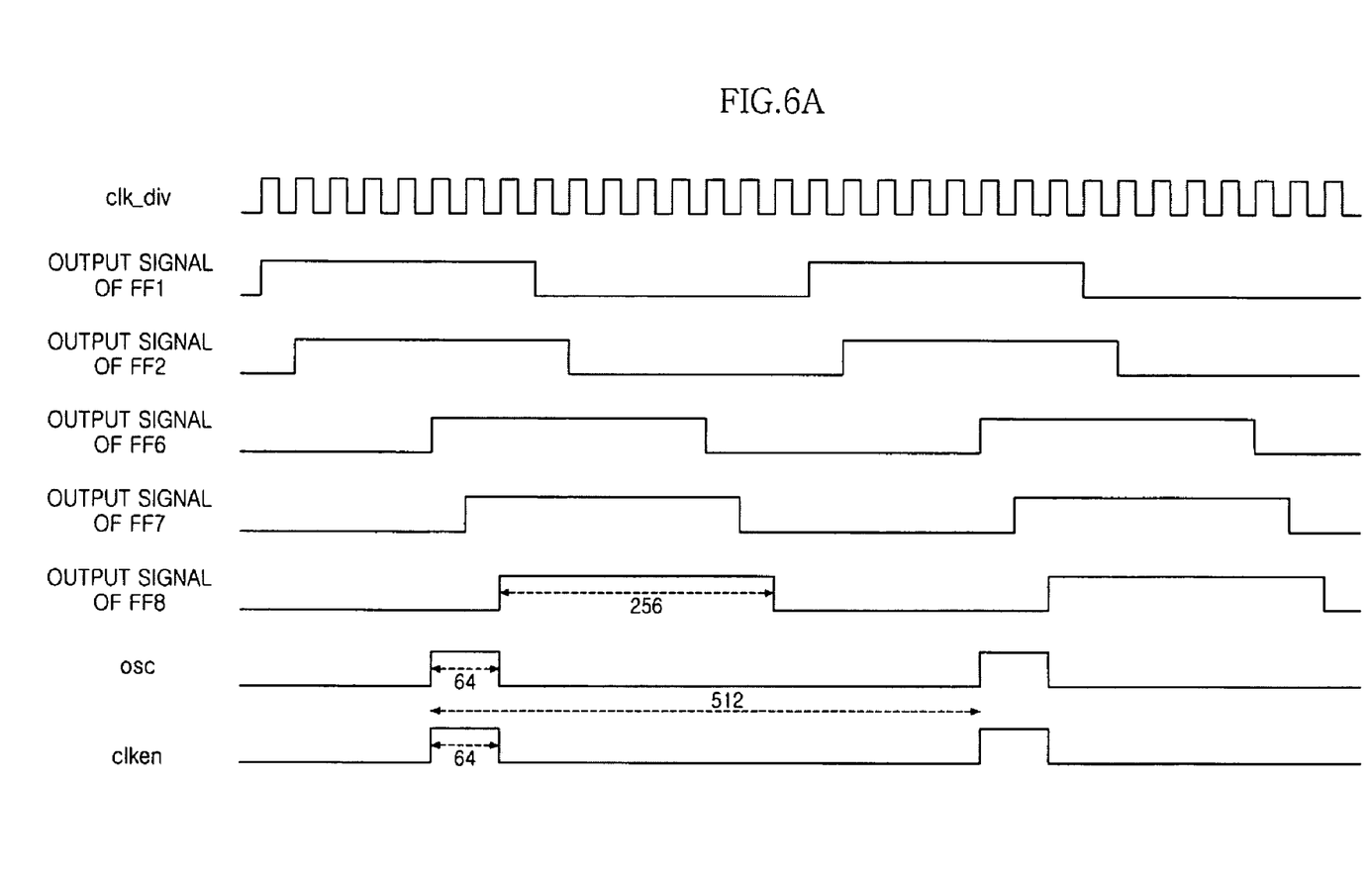
FIGS. 6A and 6B are timing charts demonstrating an exemplary operation capable of being implemented in the circuit of FIG. 1 according to one embodiment.
Figure 6B:
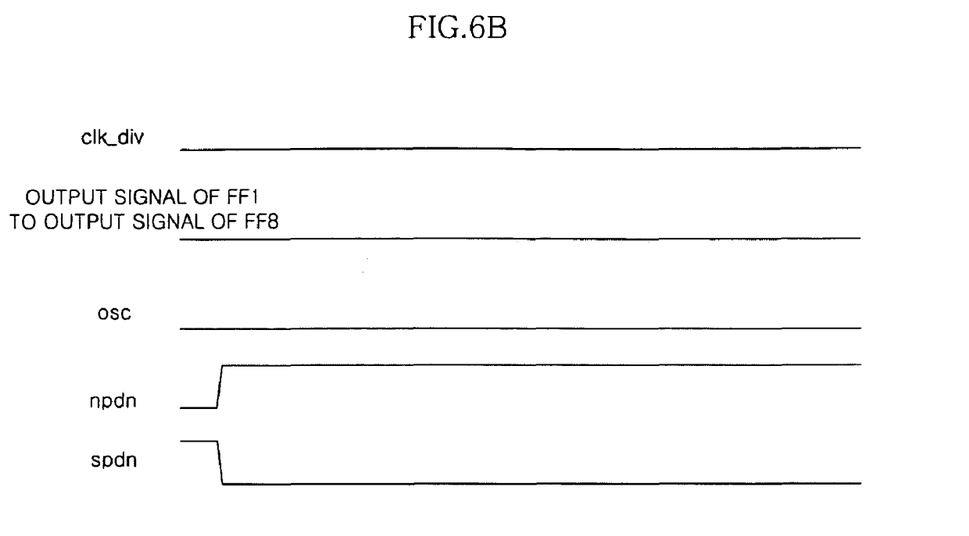

FIGS. 6A and 6B are timing charts demonstrating an exemplary operation capable of being implemented in the circuit of FIG. 1 according to one embodiment. FIG. 6A shows a waveform of each signal when the smart power down mode is implemented and the smart power down signal 'spdn' is enabled. FIG. 6B shows a waveform of each signal in the case where the smart power down mode is not executed or the precharge mode is implemented.

In FIG. 6A, it can be presumed that the division clock signal 'clk_div' has a period that is 32 times longer than a period of each of the buffering clock signal 'clk_buf' and the control clock signal 'clk_cnt'. Here, each of the output signals of the first to eighth flip-flops FF1 to FF8 can have a waveform that is shifted by one period of the division clock signal 'clk_div'. Accordingly, a high-level interval of each of the output signals of the first to eighth flip-flops FF1 to FF8 can correspond to 256 periods of each of the buffering clock signal 'clk_buf' and the control clock signal 'clk_cnt'. The oscillation signal 'osc' can be at a high level only during an interval between a rising edge of the output signal of the sixth flip-flop FF6 and a rising edge of the output signal of the eighth flip-flop FF8. The oscillation signal 'osc' can have a period that corresponds to 512 periods of each of the buffering clock signal 'clk_buf' and the control clock signal 'clk_cnt'. In addition, the oscillation signal 'osc' can have a high-level interval that corresponds to 64 periods of each of the buffering clock signal 'clk_buf' and the control clock signal 'clk_cnt'. Since the smart power down mode is executed, the clock enable signal 'clken' can have substantially the same waveform as the oscillation signal 'osc'.

In FIG. 6B, all of the control clock signal 'clk_cnt', the output signals of the first to eighth flip-flops FF1 to FF8, and the oscillation signal 'osc' can have waveforms that are substantially locked to a low level. Accordingly, the clock enable signal 'clken' can have a waveform of an inverted signal of the normal power down signal 'npdn'.

When the smart power down mode is executed, the semiconductor IC can generate the clock enable signal 'clken' that can be periodically enabled during a predetermined interval. In addition, when the smart power down mode is not executed or the precharge mode is executed, the semiconductor IC can lock all of the control clock signal 'clk_cnt', the output signals of the first to eighth flip-flops FF1 to FF8, the output signal of the second inverter IV2, and the oscillation signal 'osc' to a low level. Accordingly, if the normal power down signal 'npdn' is enabled, then the semiconductor IC can disable the clock enable signal 'clken'. Thus, when the smart power down mode is not executed or the precharge mode is executed, the semiconductor IC can inactivate the clock dividing unit 120 and the oscillating unit 130, thereby reducing power consumption.

As described above, the semiconductor IC can implement the smart power down mode to periodically activate the DLL circuit where the power down mode is executed so as to prevent a phase of an output clock signal from being changed and improve reliability of a data output operation. In the circuit structure that controls the DLL circuit, unnecessary current consumption of the circuit can be prevented by detecting whether the smart power down mode and the active mode are executed or not, thereby improving power efficiency.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor integrated circuit, comprising:
   a delay locked loop (DLL) control block configured to generate a buffer enable signal, the buffer enable signal being a pulse signal that is periodically enabled when a smart power down signal is enabled; and
   a DLL circuit configured to control a phase of an external clock signal in response to the buffer enable signal to generate an output clock signal,
   wherein the DLL control block is configured to drive a normal power down signal to generate the buffer enable signal when the smart power down signal is disabled, and the DLL control block is configured to disable the buffer enable signal when an active mode signal is disabled.

2. The semiconductor integrated circuit of claim 1, wherein the DLL control block comprises:
   a clock control unit configured to generate a control clock signal using a buffering clock in response to the smart power down signal and the active mode signal;
   a power down control unit configured to generate a clock enable signal in response to the control clock signal, the smart power down signal, and the normal power down signal; and
   a buffer control unit configured to generate the buffer enable signal in response to the clock enable signal and the active mode signal.

3. The semiconductor integrated circuit of claim 2, wherein, the clock control unit is configured to drive the buffering clock to generate the control clock signal when both the smart power down signal and the active mode signal are enabled, and to disable the control clock signal when one of the smart power down signal and the active mode signal is disabled.

4. The semiconductor integrated circuit of claim 2, wherein the power down control unit is configured to periodically oscillate a pulse signal to generate the clock enable signal when the smart power down signal is enabled, and to inversely drive the normal power down signal to generate the clock enable signal when the smart power down signal is disabled.

5. The semiconductor integrated circuit of claim 2, wherein the buffer control unit is configured to output the clock enable signal as the buffer enable signal when the active mode signal is enabled, and to disable the buffer enable signal when the active mode signal is disabled.

6. The semiconductor integrated circuit of claim 2, wherein the DLL circuit is configured to be activated and to perform the operation of using the external clock to generate the output clock when the buffer enable signal is enabled, and to stop the operation of using the external clock signal to generate the output clock signal when the buffer enable signal is disabled.

7. The semiconductor integrated circuit of claim 6, wherein the DLL circuit includes a clock input buffer configured to buffer the external clock in response to the buffer enable signal to output the buffered external clock signal as a reference clock signal.

8. The semiconductor integrated circuit of claim 7, wherein the DLL circuit is configured to delay the reference clock signal to generate the output clock signal, and to control a delay amount for the reference clock signal such that timing of the output clock signal is matched to timing of data output from a data output circuit.

9. The semiconductor integrated circuit of claim 8, wherein the DLL circuit further comprises:
   a delay line configured to delay the reference clock signal by a predetermined time in response to a delay control signal to generate a delay clock signal;
   a clock driver configured to drive the delay clock signal to output the output clock signal;

a delay compensating unit configured to apply a delay value, which is obtained by simulating a delay amount of delay elements on an output path of the delay clock signal, to the delay clock signal to generate a feedback clock signal;
a phase detecting unit configured to compare phases of the reference clock signal and the feedback clock signal to generate a phase detection signal; and
a delay control unit configured to generate the delay control signal in response to the phase detection signal.

10. The semiconductor integrated circuit of claim 1, wherein the active mode signal is enabled in response to an input of an active command, and is disabled in response to an input of a precharge command.

11. A semiconductor integrated circuit, comprising:
a delay locked loop (DLL) control block configured to generate a buffer enable signal, the buffer enable signal being a pulse signal that is periodically enabled when a smart power down signal is enabled; and
a DLL circuit configured to control a phase of an external clock signal in response to the buffer enable signal to generate an output clock signal,
wherein the smart power down signal implements a power down mode of the DLL circuit and periodically activates the DLL circuit, and is implemented by using one of a fuse option and a test mode.

12. A semiconductor integrated circuit, comprising:
a clock control unit configured to generate a control clock signal using a buffering clock in response to a smart power down signal and an active mode signal;
a power down control unit configured to generate a clock enable signal in response to the control clock signal, the smart power down signal, and a normal power down signal;
a buffer control unit configured to generate a buffer enable signal in response to the clock enable signal and the active mode signal; and
a clock input buffer configured to buffer an external clock signal in response to the buffer enable signal to output the buffered external clock as a reference clock signal.

13. The semiconductor integrated circuit of claim 12, wherein, the clock control unit is configured to drive the buffering clock to generate the control clock signal when both the smart power down signal and the active mode signal are enabled, and the clock control unit is configured to disable the control clock signal when one of the smart power down signal and the active mode signal is disabled.

14. The semiconductor integrated circuit of claim 12, wherein the power down control unit comprises:
a clock dividing unit configured to divide the control clock signal by a predetermined division ratio to generate a division clock signal;
an oscillating unit configured to periodically oscillate a pulse signal in response to the division clock signal to output the pulse signal as an oscillation signal; and
a selecting unit configured to selectively drive one of the oscillation signal and the normal power down signal in response to the smart power down signal to generate the clock enable signal.

15. The semiconductor integrated circuit of claim 14, wherein the selecting unit is configured to drive the oscillation signal to generate the clock enable signal when the smart power down signal is enabled, and the selecting unit is configured to inversely drive the normal power down signal to generate the clock enable signal when the smart power down signal is disabled.

16. The semiconductor integrated circuit of claim 12, wherein the buffer control unit is configured to output the clock enable signal as the buffer enable signal when the active mode signal is enabled, and the buffer control unit is configured to disable the buffer enable signal when the active mode signal is disabled.

17. The semiconductor integrated circuit of claim 12, wherein the clock input buffer is configured to be activated and to perform the operation of buffering the external clock signal to generate a reference clock signal when the buffer enable signal is enabled, and the clock input buffer is configured to stop the operation of buffering the external clock signal to generate the reference clock signal when the buffer enable signal is disabled.

18. The semiconductor integrated circuit of claim 17, further comprising:
a delay line configured to delay the reference clock signal by a predetermined time in response to a delay control signal to generate a delay clock signal;
a clock driver configured to drive the delay clock signal to output the output clock signal;
a delay compensating unit configured to apply a delay value, which is obtained by simulating a delay amount of delay elements on an output path of the delay clock signal, to the delay clock signal to generate a feedback clock signal;
a phase detecting unit configured to compare phases of the reference clock signal and the feedback clock signal to generate a phase detection signal; and
a delay control unit configured to generate the delay control signal in response to the phase detection signal.

19. The semiconductor integrated circuit of claim 12, wherein the smart power down signal implements a power down mode of the DLL circuit and periodically activates the DLL circuit, and is implemented by using one of a fuse option and a test mode.

20. The semiconductor integrated circuit of claim 12, wherein the active mode signal is enabled in response to an input of an active command, and is disabled in response to an input of a precharge command.

21. A method of controlling a semiconductor integrated circuit, comprising:
driving a buffering clock in response to an active mode signal during a smart power down mode to generate a control clock signal;
generating a buffer enable signal that is periodically enabled using the control clock signal;
periodically activating a delay locked loop (DLL) circuit in response to the buffer enable signal; and
disabling the control clock signal when the smart power down mode is completed,
wherein the generating a buffer enable signal occurs according to whether or not a normal power down mode is executed to control the operation of the DLL circuit.

22. The method of claim 21, wherein the generating the buffer enables signal using the control clock comprises:
dividing the control clock by a predetermined division ratio to generate a division clock signal;
periodically oscillating a pulse signal in response to the division clock signal to output the pulse signal as an oscillation signal;
driving the oscillation signal to generate a clock enable signal; and
generating the buffer enable signal in response to the clock enable signal and the active mode signal.

23. The method of claim 21, wherein the DLL circuit generates an output clock signal when the buffer enable signal is enabled.

24. The method of claim 21, wherein operation of the DLL circuit is stopped when the buffer enable signal is disabled.

25. The method of claim 21, wherein the active mode signal is enabled in response to an input of an active command, and is disabled in response to an input of a precharge command.

* * * * *